(12) United States Patent
Tanaka et al.

(10) Patent No.: US 10,097,224 B2
(45) Date of Patent: Oct. 9, 2018

(54) AGC CIRCUIT AND RADIO RECEIVER

(71) Applicant: SOCIONEXT INC., Kanagawa (JP)

(72) Inventors: Koichiro Tanaka, Takarazuka (JP); Takeaki Watanabe, Muko (JP)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 15/644,578

(22) Filed: Jul. 7, 2017

(65) Prior Publication Data

US 2017/0310350 A1    Oct. 26, 2017

Related U.S. Application Data

(63) Continuation of application No. PCT/JP2015/006399, filed on Dec. 22, 2015.

(30) Foreign Application Priority Data

Jan. 14, 2015    (JP) .................. 2015-004861

(51) Int. Cl.
*H04B 1/06* (2006.01)
*H04B 1/16* (2006.01)
(Continued)

(52) U.S. Cl.
CPC ............. *H04B 1/16* (2013.01); *H03F 3/19* (2013.01); *H03G 3/3036* (2013.01); *H03F 2200/294* (2013.01); *H03F 2200/451* (2013.01)

(58) Field of Classification Search
None
See application file for complete search history.

(56) References Cited

U.S. PATENT DOCUMENTS 5,659,582 A * 8/1997 Kojima .............. H03G 3/001
375/345
5,867,777 A * 2/1999 Yamaji .............. H03F 1/0277
330/9

(Continued)

FOREIGN PATENT DOCUMENTS

JP    H09-064666 A    3/1997
JP    2003-224488 A    8/2003
JP    2006-253816      9/2006

OTHER PUBLICATIONS

International Search Report issued in International Patent Application No. PCT/JP2015/006399, dated Mar. 15, 2016; with partial English translation.

*Primary Examiner* — Lana N Le
(74) *Attorney, Agent, or Firm* — McDermott Will & Emery LLP (57) ABSTRACT

An AGC circuit for a radio receiver includes a detector converting a high frequency signal into a baseband signal. To reduce generation of a DC offset, the AGC circuit includes: a variable gain amplifier having an amplifier circuit and a high-pass filter, the amplifier circuit amplifying the baseband signal with a variable gain and the high-pass filter coupled to the amplifier circuit and having a cut-off frequency which is variable; a controller supplying a gain control signal; and a blocker temporarily blocking the high frequency signal. Using the block control signal, the controller causes the blocker to start blocking the high frequency signal, before the cut-off frequency of the high-pass filter is switched from high to low.

10 Claims, 8 Drawing Sheets

(51) Int. Cl.
*H03G 3/30* (2006.01)
*H03F 3/19* (2006.01)

(56) References Cited

U.S. PATENT DOCUMENTS

| | | | |
|---|---|---|---|
| 2003/0142767 A1* | 7/2003 | Ichihara | H03G 3/3078 |
| | | | 375/344 |
| 2003/0157915 A1* | 8/2003 | Atkinson | B01F 5/246 |
| | | | 455/306 |
| 2004/0097212 A1 | 5/2004 | Matsumoto et al. | |
| 2005/0276359 A1* | 12/2005 | Xiong | H03G 3/001 |
| | | | 375/345 |
| 2006/0222116 A1* | 10/2006 | Hughes | H03G 1/0088 |
| | | | 375/345 |
| 2007/0166043 A1* | 7/2007 | Bouda | H04B 10/66 |
| | | | 398/147 |
| 2009/0023404 A1* | 1/2009 | Leinonen | H04B 1/1036 |
| | | | 455/114.2 |

\* cited by examiner

AGC CIRCUIT AND RADIO RECEIVER

CROSS-REFERENCE TO RELATED APPLICATIONS

This is a continuation of International Application No. PCT/JP2015/006399 filed on Dec. 22, 2015, which claims priority to Japanese Patent Application No. 2015-004861 filed on Jan. 14, 2015. The entire disclosures of these applications are incorporated by reference herein.

The present disclosure relates to an automatic gain control (AGC) circuit for a radio receiver converting a high frequency signal into a baseband signal, and a radio receiver including the AGC circuit.

BACKGROUND ART

A direct conversion receiver is a radio receiver converting a high frequency signal received by an antenna into a baseband signal, using a local oscillator signal which is the same in frequency as the high frequency signal. This technique contributes to manufacturing smaller, lighter, and further power-saving radio receivers. A problem is, however, that the technique causes a generation of a direct current (DC) offset unique to the circuit.

A typical counter measure to this problem is to provide a high path filter (HPF) in a signal path of a variable gain amplifier (VGA) to be controlled in an AGC circuit, so that a capacitor included in this HPF removes a DC component.

In such a period as a gain searching period, for a VGA, in which a large DC offset is likely to be generated, a typical technique involves setting a cut-off frequency of an HPF high to immediately mitigate the DC offset. In a period other than the gain searching period, the typical technique involves setting the cut-off frequency of the HPF low to improve accuracy in demodulation. (See Japanese Unexamined Patent Publication No. 2003-224488.)

In the above typical technique, as will be described later, a large DC offset could be generated in an output of the VGA when the cut-off frequency of the HPF is switched from high to low.

The present disclosure attempts to offer an AGC circuit and a radio receiver which reduce a generation of a DC offset in an output of a VGA.

SUMMARY

In order to achieve the above attempt, the present disclosure provides an AGC circuit for a radio receiver converting a high frequency signal into a baseband signal. The AGC circuit includes: a VGA including an amplifier circuit and a HPF, the amplifier circuit amplifying the baseband signal with a variable gain, and the HPF being coupled to the amplifier circuit and having a cut-off frequency which is variable; a controller supplying a gain control signal to the VGA; and a blocker temporarily blocking the high frequency signal, wherein the controller further causes the blocker to start blocking the high frequency signal before the cut-off frequency of the HPF is switched from high to low.

Moreover, a radio receiver according to the present disclosure includes: a detector converting a high frequency signal into a baseband signal; a VGA including an amplifier circuit and a HPF, the amplifier circuit amplifying the baseband signal with a variable gain, and the HPF being coupled to the amplifier circuit and having a cut-off frequency which is variable; a controller supplying a gain control signal to the VGA; and a blocker temporarily blocking the high frequency signal, wherein the controller further causes the blocker to start blocking the high frequency signal before the cut-off frequency of the HPF is switched from high to low.

In the present disclosure, the high frequency signal is blocked before the cut-off frequency of the HPF is switched from high to low. Hence, after a DC offset in an output from the VGA is immediately mitigated when the the high frequency signal is blocked, the cut-off frequency of the HPF is switched from high to low. Such a feature may reduce generation of the DC offset in the output from the VGA when the cut-off frequency of the HPF is switched from high to low.

DETAILED DESCRIPTION

Described in detail below is an embodiment of the present disclosure with reference to the drawings.

Figure 1:
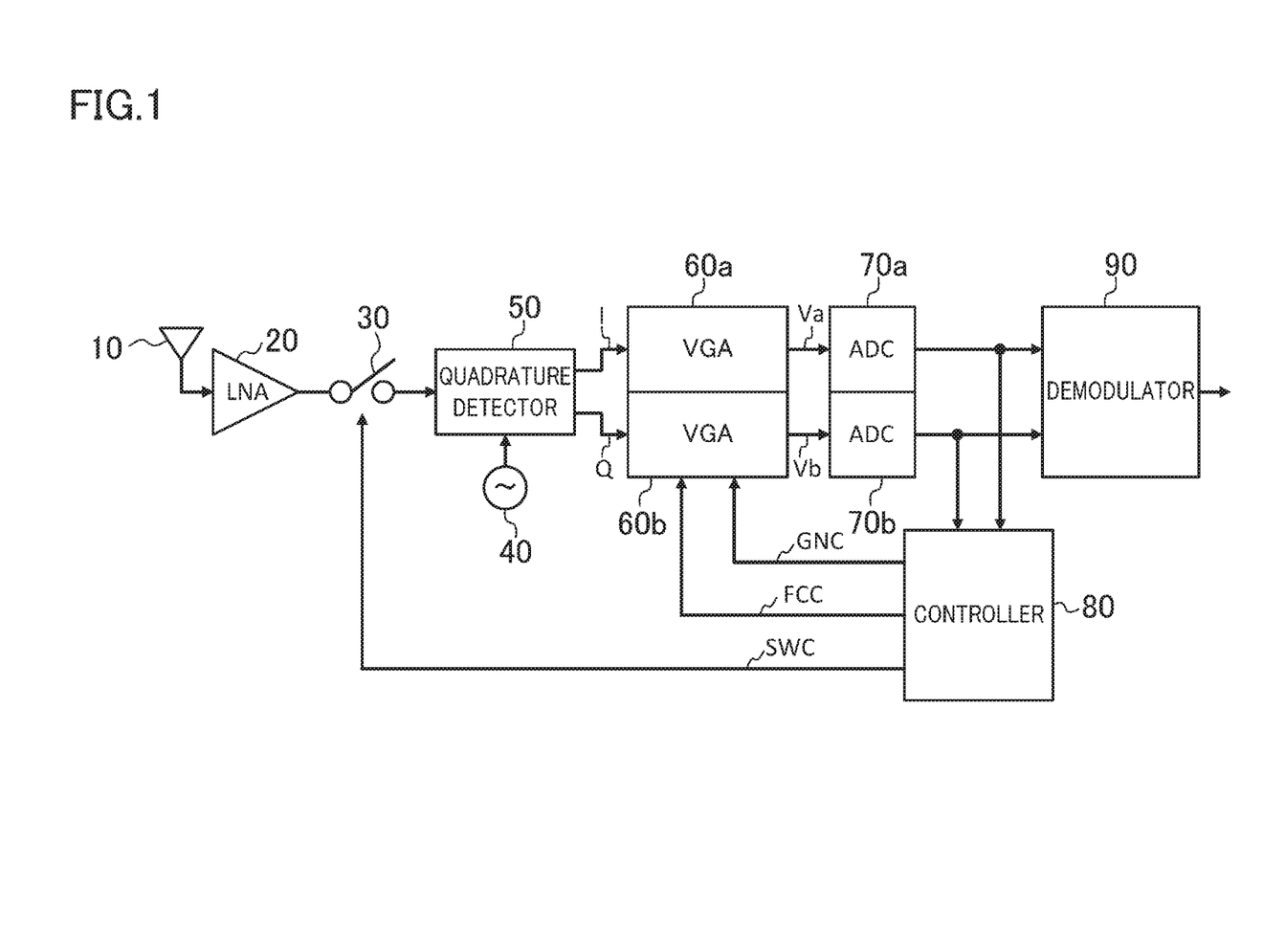
FIG. 1 is a block diagram illustrating an exemplary configuration of a radio receiver including an AGC circuit according to the present disclosure.

FIG. 1 illustrates an exemplary configuration of a radio receiver including an AGC circuit according to the present disclosure. The radio receiver in FIG. 1 is a direct conversion receiver including: an antenna 10; a low-noise amplifier (LNA) 20; a switch 30; a local oscillator 40; a quadrature detector 50; VGAs 60a and 60b; analogue-to-digital converters (ADCs) 70a and 70b; a controller 80; and a demodulator 90.

The antenna 10 receives a high frequency signal. The LNA 20 amplifies the received high frequency signal, and supplies the amplified high frequency signal to the quadrature detector 50. The switch 30 is provided between the LNA 20 and the quadrature detector 50 to temporarily block the high frequency signal. The local oscillator 40 generates a local oscillator signal which is the same in frequency as the high frequency signal received by the antenna 10. In accordance with the local oscillator signal from the local oscillator 40, the quadrature detector 50 converts the high frequency signal from the LNA 20 into baseband signals I and Q. The VGA 60a amplifies the baseband signal I and the VGA 60b amplifies the baseband signal Q. The amplified baseband signals I and Q; namely baseband signals Va and Vb, are respectively input into the ADCs 70a and 70b. The ADC 70a converts the baseband signal Va into a digital signal, and the ADC 70b converts the baseband signal Vb into another digital signal. The controller 80 supplies a gain control signal GNC to the VGAs 60a and 60b to bring an amplitude, represented as a digital signal, close to a predetermined value. Furthermore, the controller 80 functions to supply (i) the VGAs 60a and 60b with a cut-off frequency (Fc) control signal FCC, and (ii) the switch 30 with a block control signal SWC. After the controller 80 finishes the gain control of the VGAs 60a and 60b, the demodulator 90 demodulates the digitalized baseband signals from the ADCs 70a and 70b, and outputs received data.

The switch 30, the VGAs 60a and 60b, the ADCs 70a and 70b, and the controller 80, which are shown in FIG. 1, constitute an AGC circuit for the direct conversion receiver. Here, when the SWC is high (H), the switch 30 is closed. As a result, the high frequency signal from the LNA 20 is supplied to the quadrature detector 50, such that the baseband signal I is supplied to an input of the VGA 60a and the baseband signal Q is supplied to an input of the VGA 60b. In contrast, when the SWC is low (L), the switch 30 is open. As a result, the supply of the high frequency signal from the LNA 20 to the quadrature detector 50 is blocked, so are the supply of the baseband signal I to the input of the VGA 60a and the supply of the baseband signal Q to the input of the VGA 60b.

Figure 2:
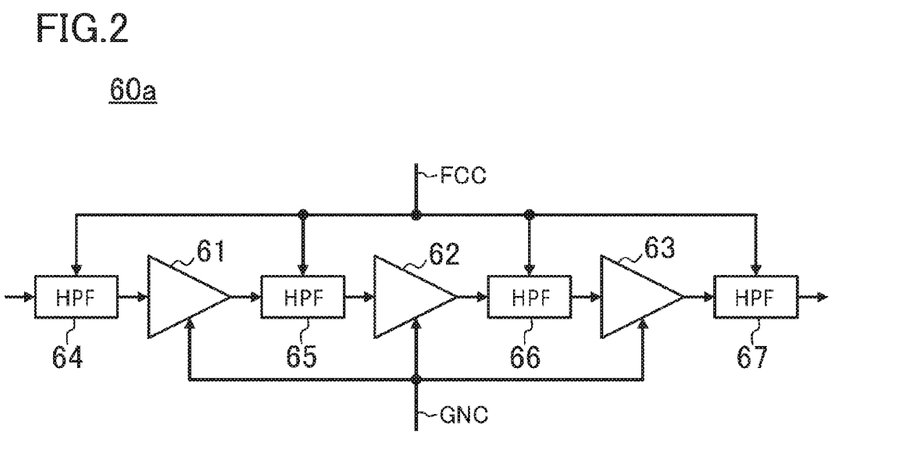
FIG. 2 is a block diagram illustrating an exemplary internal configuration of the VGA in FIG. 1.

FIG. 2 illustrates an exemplary internal configuration of the VGA 60a in FIG. 1. An internal configuration of another VGA, namely the VGA 60b, is similar to the internal configuration illustrated in FIG. 2, and shall be omitted. In order to obtain a sufficient gain, the VGA 60a in FIG. 2 includes amplifier circuits 61, 62 and 63 arranged in three stages. An HPF 64 is inserted in an input end of the amplifier circuit 61 in the first stage. An HPF 65 is inserted between the amplifier circuit 61 in the first stage and the amplifier circuit 62 in the second stage. An HPF 66 is inserted between the amplifier circuit 62 in the second stage and the amplifier circuit 63 in the third stage. An HPF 67 is inserted in an output end of the amplifier circuit 63 in the third stage. Each of the amplifier circuits 61, 62, and 63 amplifies the baseband signal with a variable gain. Each of gains is controlled by the gain control signal GNC. Moreover, each of the HPFs 64, 65, 66, and 67 has a cut-off frequency Fc which is variable. Each of cut-off frequencies Fc is controlled by an Fc control signal FCC.

Note that the amplifier circuits constituting the VGA 60a are provided in any given number of stages. Each of the amplifier circuits may receive an individual gain control signal. Furthermore, an HPF may be inserted in an input end and an output end of an amplifier circuit, and between the stages of amplifier circuits to improve an effect of reducing a DC offset generated in the amplifier circuits themselves. However, the HPF does not have to be provided to all of these positions. Moreover, each of the HPFs may have a different cut-off frequency Fc.

Figure 3:
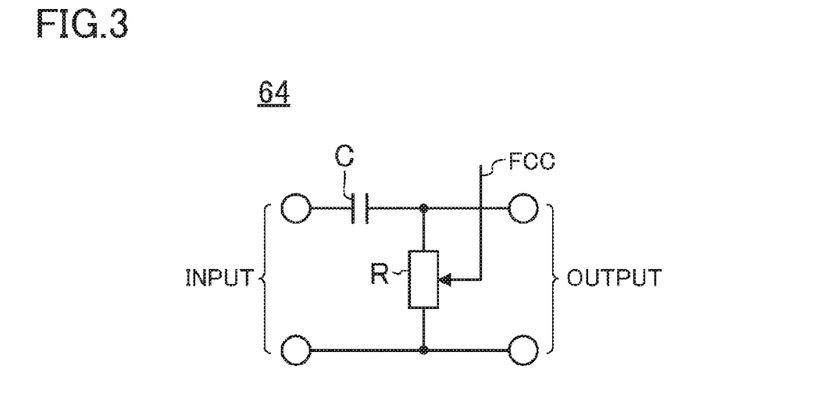
FIG. 3 is a circuit diagram illustrating an exemplary internal configuration of the HPF in FIG. 2.

FIG. 3 illustrates an exemplary internal configuration of the HPF 64 in FIG. 2. Internal configurations of other HPFs in FIG. 2, namely the HPFs 65, 66, and 67, are similar to the internal configuration illustrated in FIG. 3, and shall be omitted. The HPF 64 in FIG. 3 includes a capacitor C and a resistor R. Moreover, a resistance of the resistor R is controlled with the Fc control signal FCC. Here, when the FCC is high (H), the resistor R is controlled to have a small resistance, so that a circuit time constant of the HPF 64 decreases. As a result, the cut-off frequency Fc of the HPF 64 increases. In contrast, when FCC is low (L), the resistor R is controlled to have a large resistance, so that the circuit time constant of the HPF 64 increases. As a result, the cut-off frequency Fc of the HPF 64 decreases.

Figure 4:
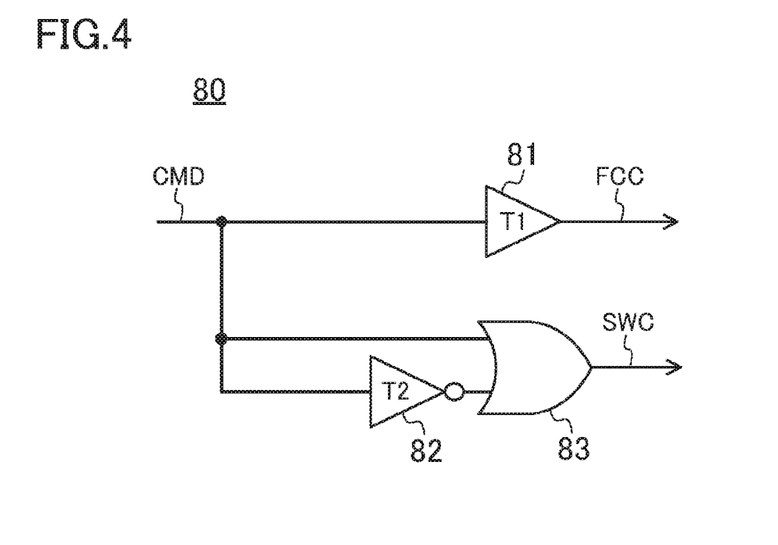
FIG. 4 is a circuit diagram partially illustrating an exemplary internal configuration of a controller in FIG. 1.
Figure 5A:
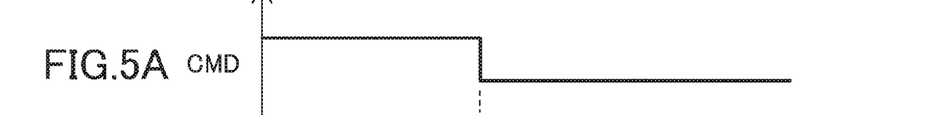
FIGS. 5A, 5B, and 5C are signal waveform diagrams for illustrating an operation of the circuit in FIG. 4.
Figure 5B:
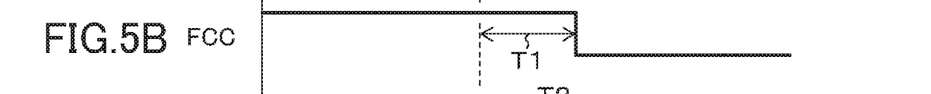
Figure 5C:
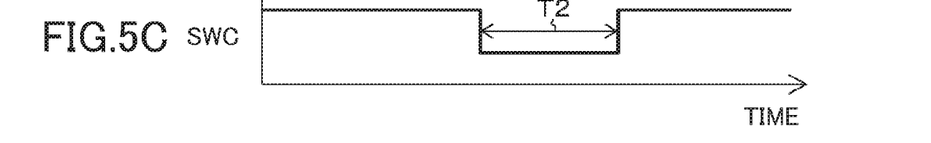

FIG. 4 partially illustrates an exemplary internal configuration of the controller 80 in FIG. 1. Moreover, FIGS. 5A to 5C are signal waveform diagrams illustrating an operation of the circuit in FIG. 4. Note that FIG. 4 illustrates, out of the internal configuration of the controller 80, a part related to the Fc control signal FCC and the block control signal SWC alone.

The controller 80 in FIG. 4 includes: a first delay circuit 81 having a non-inverted output; a second delay circuit 82 having an inverted output; and an OR circuit 83. The first delay circuit 81 delays by a time T1 a cut-off frequency (Fc) switching command CMD transiting from high to low, to output the Fc control signal FCC illustrated in FIG. 5B. The second delay circuit 82 delays by a time T2 the Fc switching command CMD, and inverts an output logic. Here, a relationship T1≤T2 holds. The OR circuit 83 receives the Fc switching command CMD and an output from the second delay circuit 82, and outputs the block control signal SWC illustrated in FIG. 5C.

As described above, the controller 80 in FIG. 4 includes a circuit generating the Fc control signal FCC and the block control signal SWC based on one Fc switching command CMD. The controller 80 in FIG. 4 allows the block control signal SWC to fall before the Fc control signal FCC falls. Specifically, this controller 80 causes the switch 30 to start blocking the high frequency signal before the cut-off frequencies Fc of the HPFs 64 to 67 are switched from high to low. Moreover, the controller 80 in FIG. 4 keeps the block control signal SWC from rising before the Fc control signal FCC falls. Specifically, this controller 80 further causes the switch 30 to leave the high frequency signal blocked before the cut-off frequencies Fc of the HPFs 64 to 67 are switched from high to low.

FIGS. 6A to 6D are signal waveform diagrams for illustrating an operation of the radio receiver in FIG. 1. Furthermore, FIGS. 7A to 7D are signal waveform diagrams illustrated with a time axis of FIGS. 6A to 6D enlarged. Here, a reception gain is significantly changed for searching a gain when reception of a packet starts, as observed in a wireless LAN and a packet receiver on millimeter-wave communication.

The controller 80 in the initial state supplies the gain control signal GNC to the VGAs 60a and 60b to increase the gains of the VGAs 60a and 60b. Specifically, the gains of the VGAs 60a and 60b are set high in the initial state so that the input of the high frequency signal may be detected even when the received high frequency signal is faint. Moreover, after the input of the high frequency signal is detected, the gain has to be significantly changed in a short period of time. Hence, the cut-off frequencies Fc of the HPFs 64 to 67 are set high with the FCC set high in the initial state, so that a DC offset is immediately mitigated.

A high frequency signal in the form of a packet starts to be input at a time 0 ns. Before the time 0 ns, as illustrated in FIG. 6D, a signal having a small amplitude is output as an amplified baseband signal Va. Here, the small amplitude is caused by thermal noise due to a configuration from the LNA 20 to the VGA 60a. In the illustrated example, the input of the high frequency signal is interpreted to be detected when a period of an amplitude, significantly exceeding the amplitude caused by the thermal noise, exceeds approximately 100 ns.

Figure 6A:
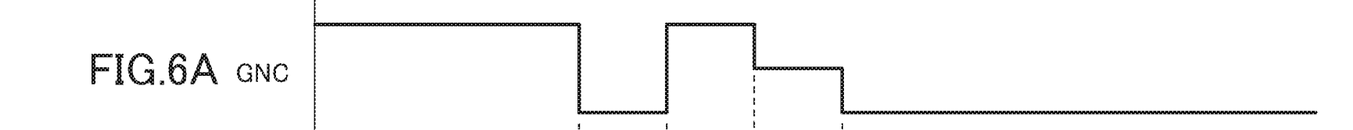
FIGS. 6A, 6B, 6C, and 6D are signal waveform diagrams for illustrating an operation of the radio receiver in FIG. 1.

When the input of the high frequency signal is detected under this condition, a gain control value is searched (between time 110 ns and 360 ns) while the gain control signal GNC is raised and dropped as illustrated in FIG. 6A. The gain control value allows the amplitude, which is represented as a digital signal from the ADCs 70a and 70b, to approximate to a predetermined value.

Figure 6B:
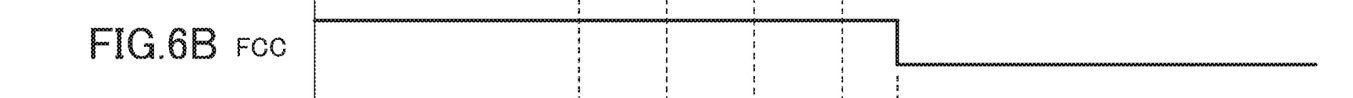
Figures 7A, 7B:
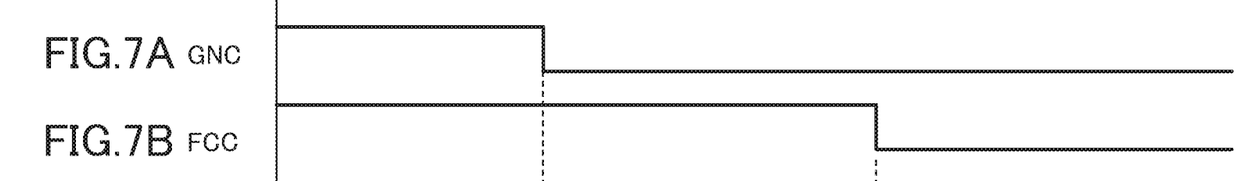
FIGS. 7A, 7B, 7C, and 7D are signal waveform diagrams illustrated with a time axis of FIGS. 6A to 6D enlarged.

When the search ends, the Fc control signal FCC is switched from high to low (at time 370 ns) as illustrated in FIGS. 6B and 7B, so that the cut-off frequencies Fc of HPFs 64 to 67 are set low. Setting the cut-off frequencies Fc low creates a regular reception state in which the accuracy in demodulation is improved.

After that, either the gain control value may be fine-tuned so that the amplitude represented as the digital signal further approximates to the predetermined value, or the demodulator 90 may proceed to demodulation. Note that in the example in FIGS. 6A to 6D, the gain control value is not fine-tuned.

Figure 6C:
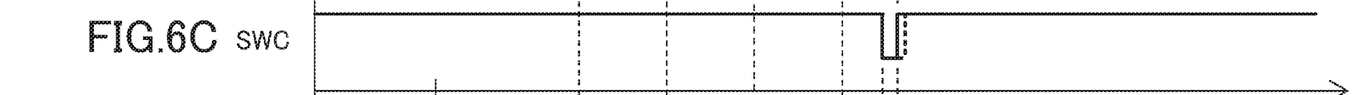
Figure 6D:
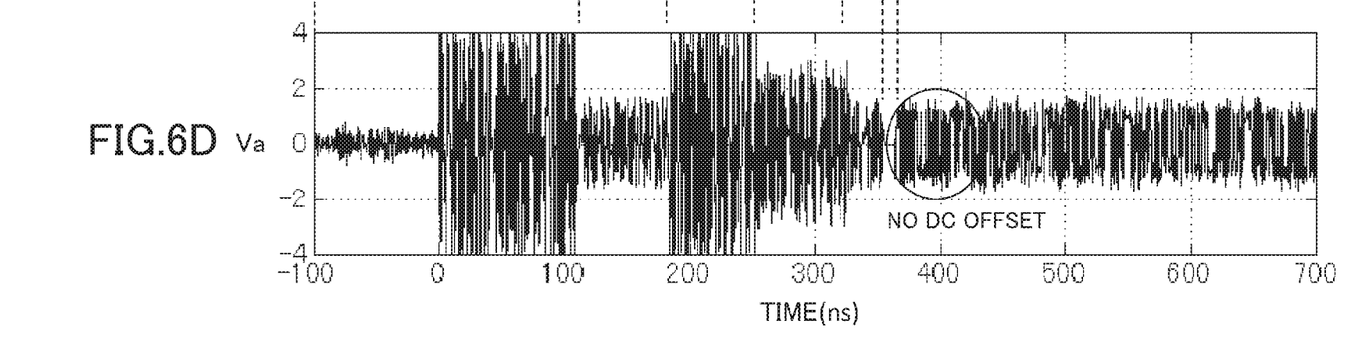
Figure 7C:
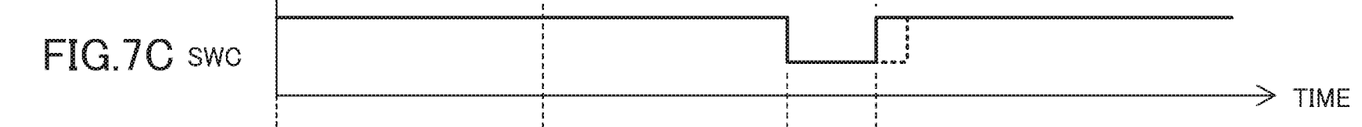
Figure 7D:
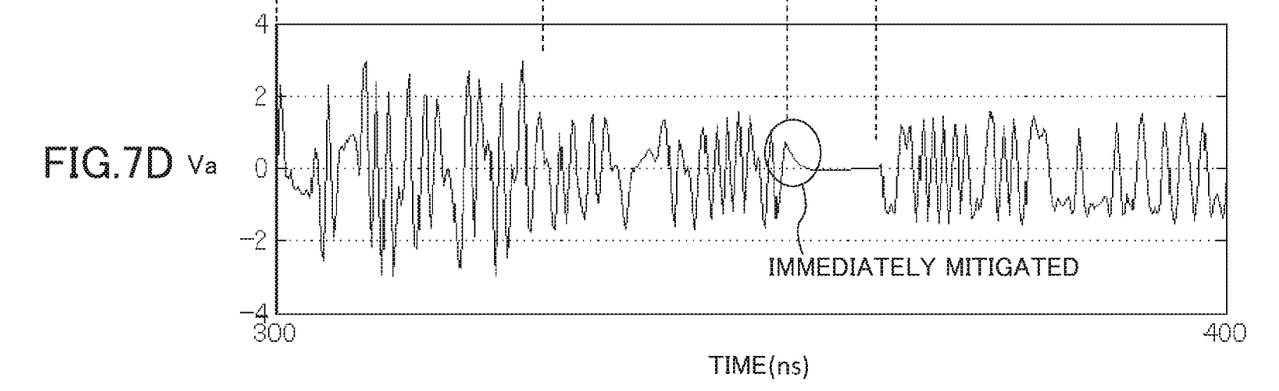
Figure 8A:
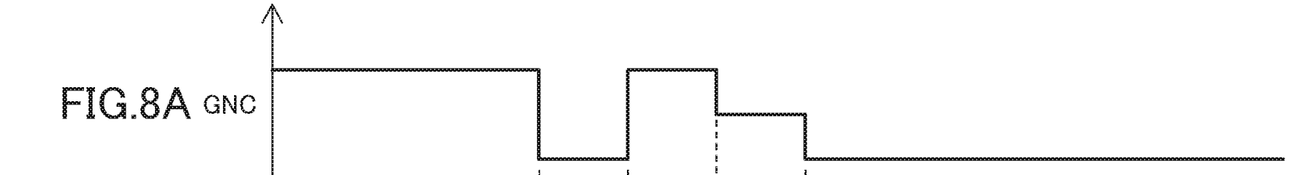
FIGS. 8A, 8B, 8C, and 8D are signal waveform diagrams for illustrating an operation of a comparative example with respect to the radio receiver in FIG. 1.
Figure 8B:
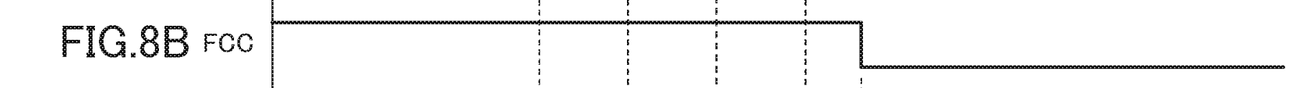
Figures 8C, 8D:
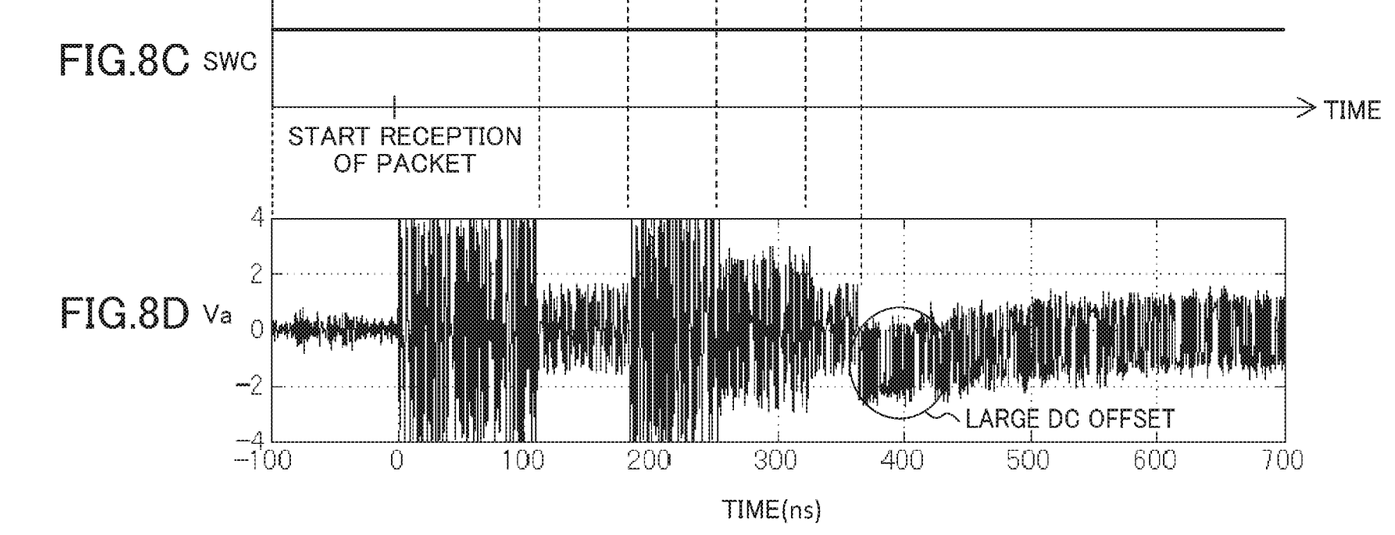

Described next is the block control signal SWC. As illustrated in FIGS. 6C and 7C, the controller 80 causes the switch 30 to (i) start blocking the high frequency signal (the SWC is low) before a fall of the Fc control signal FCC, and (ii) finish blocking the high frequency signal (the SWC is high) since a fall of the Fc control signal FCC. Hence, controlling the blocking of a signal to be input into the quadrature detector 50 achieves effects below.

When the reception starts, the FCC is set high to adjust a gain. Here, circuit time constants of HPFs 64 to 67 are small. That is why a DC offset, which may be generated in the baseband signal Va, is immediately mitigated. When the adjustment of the gain ends, the block control signal SWC is transited from high to low so that the signal to be input into the quadrature detector 50 is blocked. Here, even though a value of the voltage of the baseband signal Va and a value of the voltage stored in the capacitor C in each of the HPFs 64 to 67 are not zero when the signal is blocked, the FCC is still high. Hence, the voltage of the baseband signal Va is immediately mitigated to zero. (See a circle in FIG. 7D.) After that even though the FCC is set low or the SWC is set high, the output from VGA 60a is started with the voltage of the baseband signal Va at zero; that is, without the DC offset. Hence, when the gain is further fine-tuned at this moment, the adjustment of the gain cannot be disturbed by the DC offset. In addition, when a regular demodulation is immediately started, the risk of creating erroneous data due to a decrease in the precision of a demodulated signal may be reduced.

FIGS. 8A to 8D are signal waveform diagrams for illustrating an operation of a comparative example with respect to the radio receiver in FIG. 1. Here, the SWC is maintained high so that the switch 30 does not block a signal no matter when the Fc control signal FCC falls. In this case, when the adjustment of the gain ends and the transition of the Fc control signal FCC from high to low sets the cut-off frequencies Fc of the HPFs 64 to 67 low, a large DC offset can be generated (in an example in FIG. 8D, a large DC offset is generated in a negative direction) in the baseband signal Va, depending on the value of the voltage of the baseband signal Va and the value of the voltage stored in the capacitor C in each of the HPFs 64 to 67 observed at the moment of the setting. When a large DC offset is generated, it takes a long time until this DC offset is mitigated. Hence, when the gain is further fine-tuned at this moment, the adjustment of the gain is disturbed by the DC offset. When a regular demodulation is immediately started, erroneous data is created due to a decrease in the precision of a demodulated signal.

Note that, in FIG. 1, the blocked signal is not the baseband signal that is the output from the quadrature detector 50, but the high frequency signal before quadrature detection. This is because when the signal is blocked after the quadrature detection, a value of the DC offset included in the output from the quadrature detector 50 and input into the VGAs 60a and 60b inevitably varies, depending on whether the signal is blocked. In this case, a new DC offset is to be input into the VGAs 60a and 60b when the blocking of the signal is canceled, also generating a large DC offset in an output Va from the VGA 60a and an output Vb from the VGA 60b.

Moreover, as illustrated by broken lines in FIGS. 6C and 7C, when the switch 30 is turned on to cancel the blocking after the cut-off frequencies Fc of the HPFs 64 to 67 are set low, the generation of the DC offset is reliably reduced despite an error in timing occurring when a control signal is generated and a delay occurring in various parts of the circuit.

Finally described will be three modifications according to the radio receiver handling beamforming.

Figure 9:
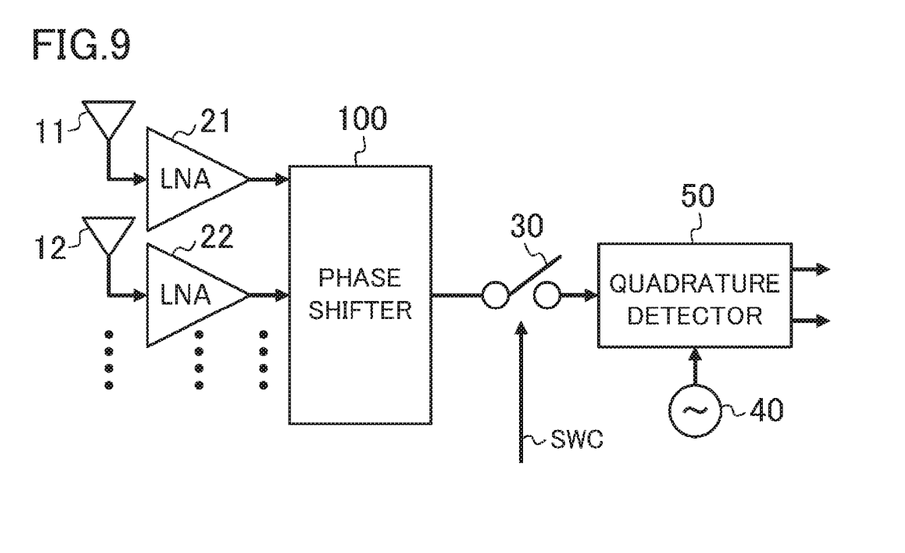
FIG. 9 is a block diagram illustrating a first modification of the radio receiver in FIG. 1.

FIG. 9 illustrates a first modification of the radio receiver in FIG. 1. The radio receiver in FIG. 9 includes: an antenna 11 and an antenna 12; an LNA 21 amplifying a high frequency signal received by the antennal 11 and an LNA 22 amplifying another high frequency signal received by the antenna 12; and a phase shifter 100 adjusting a phase and an amplitude of outputs from the LNAs 21 and 22, and supplies a combined output to the quadrature detector 50. One switch 30 is provided between the phase shifter 100 and the quadrature detector 50.

In accordance with a configuration in FIG. 9, the high frequency signals received by the antennas 11 and 12 are respectively amplified by the LNAs 21 and 22. The amplified high frequency signals are then adjusted and combined in a combined signal by the phase shifter 100. The combined signal is supplied to the quadrature detector 50. In this case, just one switch 30 is sufficient for blocking the combined signal. In accordance with the configuration in FIG. 9, in the case where a local oscillator signal to be used for quadrature detection leaks into the phase shifter 100, and the leaking local oscillator signal is quadrature-detected to generate an DC offset, the DC offset changes at every time of switching of the block control signal SWC. As a result, the DC offset cannot be sufficiently reduced.

Figure 10:
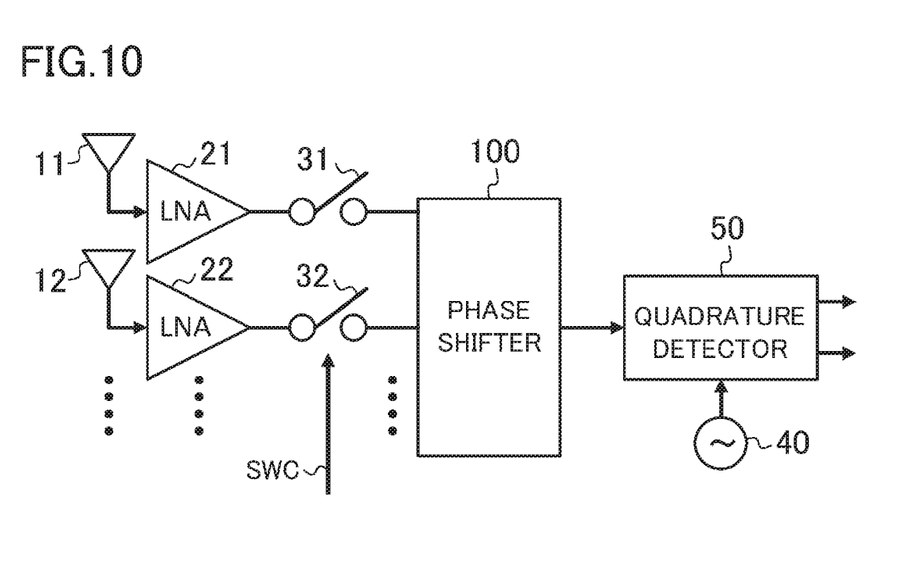
FIG. 10 is a block diagram illustrating a second modification of the radio receiver in FIG. 1.

FIG. 10 illustrates a second modification of the radio receiver in FIG. 1. The radio receiver in FIG. 10 includes: a switch 31 between the LNA 21 and the phase shifter 100; and a switch 32 between the LNA 22 and the phase shifter 100.

In accordance with the configuration in FIG. 10, the switch 31 blocks a high frequency signal between the LNA 21 and the phase shifter 100, and the switch 32 blocks another high frequency signal between the LNA 22 and the phase shifter 100. In accordance with the configuration in FIG. 10, two or more of the switches 31 and 32 are required for blocking the signals; however, even though the local oscillator signal to be used for the quadrature detection leaks into the phase shifter 100, and the leaking local oscillator signal is quadrature-detected to generate a DC offset, the DC offset may be reduced.

Figure 11:
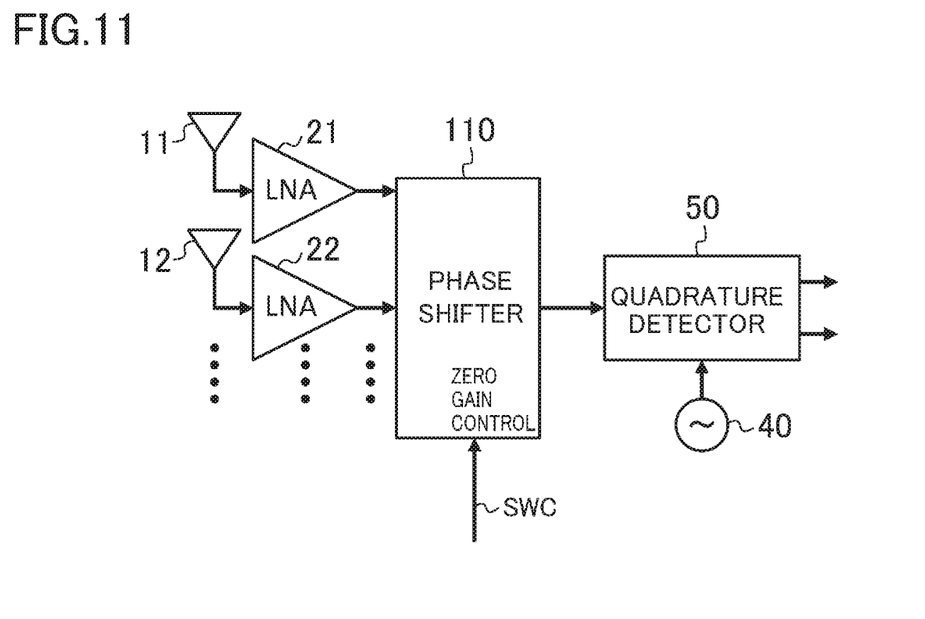
FIG. 11 is a block diagram illustrating a third modification of the radio receiver in FIG. 1.

FIG. 11 illustrates a third modification of the radio receiver in FIG. 1. The radio receiver in FIG. 11 allows the switches 31 and 32 in FIG. 10 to operate through zero-gain control by a phase shifter 110.

In accordance with a configuration of FIG. 11, the phase shifter 110 is controlled to set a zero amplitude gain to each of the signals. As a result, each signal is blocked. Such a feature may omit a switch for blocking the signals.

As can be seen, the AGC circuit and the radio receiver according to the present disclosure effectively reduce the DC offset generated in an output from a VGA when a cut-off frequency of an HPF is switched from high to low. Such an AGC circuit and a radio receiver are useful as, for example, a radio receiver converting a high frequency signal into a baseband signal.

What is claimed is:

1. An automatic gain control (AGC) circuit for a radio receiver having a detector for converting a high frequency signal into a baseband signal, the AGC circuit comprising:
   a variable gain amplifier including an amplifier circuit and a high-pass filter, the amplifier circuit amplifying the baseband signal with a variable gain, and the high-pass filter being coupled to the amplifier circuit and having a cut-off frequency which is variable; a controller supplying a gain control signal to the amplifier circuit and a cut-off frequency control signal to the high-pass filter of the variable gain amplifier; and
   a switch temporarily blocking the high frequency signal from being supplied to the detector, wherein
   the controller further causes the switch to start blocking the high frequency signal before the cut-off frequency of the high-pass filter is switched from high to low from the cut-off frequency control signal.

2. The AGC circuit of claim 1, wherein the controller causes the switch to leave the high frequency signal blocked before the cut-off frequency of the high-pass filter is switched from high to low.

3. The AGC circuit of claim 1, wherein the controller includes a circuit generating the cut-off frequency control signal and a block control signal based on one cut-off frequency switching command, the cut-off frequency control signal being for controlling the cut-off frequency of the high-pass filter and the block control signal being for causing the switch to block the high frequency signal.

4. A radio receiver comprising:
   a detector converting a high frequency signal into a baseband signal;
   a variable gain amplifier including an amplifier circuit and a high-pass filter, the amplifier circuit amplifying the baseband signal with a variable gain, and the high-pass filter being coupled to the amplifier circuit and having a cut-off frequency which is variable;
   a controller supplying a gain control signal to the amplifier circuit and a cut-off frequency control signal to the high-pass filter of the variable gain amplifier;
   and a switch temporarily blocking the high frequency signal from being supplied to the detector, wherein
   the controller further causes the switch to start blocking the high frequency signal before the cut-off frequency of the high-pass filter is switched from high to low from the cut-off frequency control signal.

5. The radio receiver of claim 4, further comprising: the controller causes the switch to leave the high frequency signal blocked before the cut-off frequency of the high-pass filter is switched from high to low.

6. The radio receiver of claim 4, wherein the controller includes a circuit generating the cut-off frequency control signal and a block control signal based on one cut-off frequency switching command, the cut-off frequency control signal being for controlling the cut-off frequency of the high-pass filter and the block control signal being for causing the switch to block the high frequency signal.

7. The radio receiver of claim 4, further comprising a low noise amplifier for amplifying the high frequency signal and supplying the amplified high frequency signal to the detector, wherein the switch is provided between the low noise amplifier and the detector.

8. The radio receiver of claim 4, further comprising: low noise amplifiers, each of the low noise amplifiers receiving and amplifying a corresponding one of high frequency signals; and a phase shifter adjusting a phase and an amplitude of outputs, each of the outputs from a corresponding one of the low noise amplifiers, and supplying a combined output to the detector, wherein the switch is provided between the phase shifter and the detector.

9. The radio receiver of claim 4, further comprising: low noise amplifiers, each of the low noise amplifiers receiving and amplifying a corresponding one of high frequency signals; and a phase shifter adjusting a phase and an amplitude of outputs, each of the outputs from a corresponding one of the low noise amplifiers, and supplying a combined output to the detector, wherein the switch includes switches, each of the switches being provided between a corresponding one of the low noise amplifiers and the phase shifter.

10. The radio receiver of claim 4, further comprising: low noise amplifiers, each of the low noise amplifiers receiving and amplifying a corresponding one of high frequency signals; and a phase shifter adjusting a phase and an amplitude of outputs, each of the outputs from a corresponding one of the low noise amplifiers, and supplying a combined output to the detector, wherein the switch operates through zero-gain control by the phase shifter.

* * * * *